(12) United States Patent
Jia et al.

(10) Patent No.: US 12,213,371 B2
(45) Date of Patent: Jan. 28, 2025

(54) PREPARATION METHODS FOR ORGANIC FUNCTIONAL LAYERS OF LIGHT-EMITTING DEVICE AND PREPARATION METHODS FOR DISPLAY PANEL

(71) Applicants: Hefei BOE Joint Technology Co., Ltd., Anhui (CN); BOE Technology Group Co., Ltd., Beijing (CN)

(72) Inventors: Wenbin Jia, Beijing (CN); Kaihong Ma, Beijing (CN); Zhijie Ye, Beijing (CN)

(73) Assignees: Hefei BOE Joint Technology Co., Ltd., Anhui (CN); BOE Technology Group Co., Ltd., Beijing (CN)

( * ) Notice: Subject to any disclaimer, the term of this patent is extended or adjusted under 35 U.S.C. 154(b) by 350 days.

(21) Appl. No.: 17/637,965

(22) PCT Filed: Mar. 22, 2021

(86) PCT No.: PCT/CN2021/082180
§ 371 (c)(1),
(2) Date: Feb. 24, 2022

(87) PCT Pub. No.: WO2021/213110
PCT Pub. Date: Oct. 28, 2021

(65) Prior Publication Data
US 2022/0278277 A1 Sep. 1, 2022

(30) Foreign Application Priority Data
Apr. 24, 2020 (CN) .......................... 202010334077.8

(51) Int. Cl.
*H10K 71/13* (2023.01)
*H10K 59/12* (2023.01)
(Continued)

(52) U.S. Cl.
CPC ....... *H10K 71/135* (2023.02); *H10K 59/1201* (2023.02); *H10K 59/122* (2023.02); *H10K 71/00* (2023.02)

(58) Field of Classification Search
None
See application file for complete search history.

(56) References Cited

U.S. PATENT DOCUMENTS

2006/0046062 A1 3/2006 Nishigaki et al.
2011/0177304 A1 7/2011 Rokuhara
(Continued)

FOREIGN PATENT DOCUMENTS

CN 102349132 A 2/2012
CN 103069554 A 4/2013
(Continued)

OTHER PUBLICATIONS

CN2020103340778 first office action.
PCT/CN2021/082180 international search report.

*Primary Examiner* — Michelle Mandala
(74) *Attorney, Agent, or Firm* — IPro, PLLC

(57) ABSTRACT

A method of preparing organic functional layers of light-emitting device including: forming a plurality of holding portions in a pixel definition layer on a substrate; forming a plurality of ink droplets in the holding portions, the ink droplets including a first solvent, a second solvent and one or more solutes, a first saturated vapor pressure of the first solvent being higher than a second saturated vapor pressure of the second solvent, a solubility of the solutes in the first solvent being less than a solubility of the solutes in the second solvent, and a first affinity of lower parts of side walls of the holding portions for the first solvent is greater than a second affinity of the lower parts of the side walls of the holding portions for the second solvent; adjusting a vacuum degree of vacuum drying equipment to a first vacuum degree (Continued)

below the first saturated vapor pressure and above the second saturated vapor pressure to completely remove the first solvent; and adjusting the vacuum degree of the vacuum drying equipment to a second vacuum degree below the saturated vapor pressure of the second solvent to completely remove the second solvent.

14 Claims, 8 Drawing Sheets

(51) Int. Cl.
*H10K 59/122* (2023.01)
*H10K 71/00* (2023.01)

(56) References Cited

U.S. PATENT DOCUMENTS

| | | | |
|---|---|---|---|
| 2011/0189617 A1* | 8/2011 | Naka | G03F 7/20 430/325 |
| 2011/0305824 A1 | 12/2011 | Chesterfield et al. | |
| 2013/0143357 A1 | 6/2013 | Goto et al. | |
| 2017/0213966 A1 | 7/2017 | Wang et al. | |
| 2019/0296239 A1* | 9/2019 | Jia | H10K 71/00 |
| 2019/0355939 A1* | 11/2019 | Fukuda | H10K 71/40 |
| 2020/0091251 A1 | 3/2020 | Hu et al. | |

FOREIGN PATENT DOCUMENTS

| | | | |
|---|---|---|---|
| CN | 104908423 A | 9/2015 | |
| CN | 106335298 A | 1/2017 | |
| CN | 107403824 A | 11/2017 | |
| CN | 108336123 A | 7/2018 | |
| CN | 108400259 A | 8/2018 | |
| CN | 108735900 A | 11/2018 | |
| CN | 109216573 A | 1/2019 | |
| CN | 110172274 A | 8/2019 | |
| CN | 111509144 A | 8/2020 | |
| JP | 2006068598 A | 3/2006 | |

* cited by examiner

Surface profile of a section of organic functional layers along A'-A'

Surface profile of a section of organic functional layers along B'-B'

Surface profile of a section of organic functional layers along A-A

Surface profile of a section of organic functional layers along B-B

| | Short side | Long side | Area thickness uniformity |
|---|---|---|---|
| Pixel P' | 15% | 5% | 63% |
| Pixel P | 7.5% | 2% | 81.60% |

PREPARATION METHODS FOR ORGANIC FUNCTIONAL LAYERS OF LIGHT-EMITTING DEVICE AND PREPARATION METHODS FOR DISPLAY PANEL

CROSS-REFERENCE TO RELATED APPLICATIONS

The present application is a US national phase of International patent application No. PCT/CN2021/082180 filed on Mar. 22, 2021, which claims priority to Chinese Patent Application No. 202010334077.8, entitled "Preparation methods of OLED device and preparation methods of display panel" filed on Apr. 24, 2020 to CNIPA, the contents of which are incorporated here in its entirety by reference.

TECHNICAL FIELD

Embodiments of the present disclosure relate to preparation methods of organic functional layer of light-emitting device, preparation methods of display panel and display panels.

BACKGROUND

Organic Light-Emitting Device (OLED), as a new type of light-emitting device, has presented enormous application potentials in the display and lighting field and therefore has received intensive attention from the academic and industrial community. In the display field, compared with LCD, OLED has advantages of self-luminance, fast response, wide field of view, high brightness, bright color, light and thin, etc., and is regarded as the next-generation display technology.

SUMMARY

At least one embodiment of the present disclosure provides a method of preparing organic functional layers of a light-emitting device, including: forming a pixel definition layer on a substrate and forming a plurality of holding portions in the pixel definition layer; forming a plurality of ink droplets in the holding portions, the ink droplets being configured to form the organic functional layers of the light-emitting device and including a plurality of solvents and one or more solutes, the solvents including a first solvent and a second solvent, where a first saturated vapor pressure of the first solvent is higher than a second saturated vapor pressure of the second solvent, a first solubility of the one or more solutes in the first solvent is less than a second solubility of the one or more solutes in the second solvent, a first affinity of lower parts of side walls of the holding portions near the substrate for the first solvent is greater than a second affinity of the lower parts of the side walls of the holding portions near the substrate for the second solvent; adjusting a vacuum degree of vacuum drying equipment to a first vacuum degree, the first vacuum degree being lower than the first saturated vapor pressure and higher than the second saturated vapor pressure to cause the first solvent to escape from the ink droplets, maintaining the first vacuum degree until the first solvent is completely removed; adjusting the vacuum degree of the vacuum drying equipment to a second vacuum degree, the second vacuum degree being lower than the second saturated vapor pressure to cause the second solvent to escape from the ink droplets, and maintaining the second vacuum degree until the second solvent is completely removed.

In some embodiments of the present disclosure, the first solvent, the second solvent and the lower parts of the side walls of the holding portions are lyophilic, a molecular polarity of the first solvent is greater than a molecular polarity of the second solvent, and the molecular polarity of the second solvent is 0~2.5.

In some embodiments of the present disclosure, the first solvent, the second solvent and the lower parts of the side walls of the holding portions are lyophilic, the first solvent includes at least one of cyclohexylbenzene, carbonate, alkyl aromatic hydrocarbon, aromatic hydrocarbon, aromatic ester, 4-methylanisole, toluene, 1,3-dimethyl-2-imidazolinone, diethylene glycol, or 2-(2-methoxyethoxy)ethanol, and the second solvent includes at least one of 1,4-dioxane, dichlorobenzene, diphenyl ether, dodecane, sulfolane or ethylene glycol dimethyl ether.

In some embodiments of the present disclosure, the first solvent, the second solvent and the lower parts of the side walls of the holding portions are lyophobic, a molecular polarity of the second solvent is greater than a molecular polarity of the first solvent, and the molecular polarity of the first solvent is 0~2.5.

In some embodiments of the present disclosure, the first solvent, the second solvent, and the lower parts of the side walls of the holding portions are lyophobic, the first solvent includes at least one of cyclohexane, isooctane, trimethylpentane, diethylene glycol or ethylene glycol dimethyl ether, and the second solvent includes at least one of carbon tetrachloride, trichloroethylene, cyclopentane or propyl ether.

In some embodiments of the present disclosure, the first saturated vapor pressure is greater than or equal to 105% of the second saturated vapor pressure.

In some embodiments of the present disclosure, in the solvents of the ink droplets, a volume proportion of the first solvent is greater than or equal to 70% and a volume proportion of the second solvent is less than or equal to 30%.

In some embodiments of the present disclosure, in the solvents of the ink droplets, a volume proportion of the first solvent is 70%~90% and a volume proportion of the second solvent is 10%~30%.

In some embodiments of the present disclosure, an absolute value of a difference between a first surface tension coefficient of the first solvent and a second surface tension coefficient of the second solvent is less than 5% of the first surface tension coefficient.

In some embodiments of the present disclosure, a first surface tension of the first solvent is the same as a second surface tension of the second solvent.

In some embodiments of the present disclosure, forming the pixel definition layer on the substrate includes: forming a first pixel definition layer on the substrate; and forming a second pixel definition layer on the first pixel definition layer; where the first pixel definition layer and the second pixel definition layer show opposite properties for a same liquid phase medium.

In some embodiments of the present disclosure, forming the plurality of ink droplets in the holding portions includes forming the plurality of ink droplets in the holding portions by an ink jet printing process.

At least one embodiment of the present disclosure provides a method of preparing a display panel including a method of preparing organic functional layers of a light-emitting device as described above.

At least one embodiment of the present disclosure also provides a display panel including organic functional layers of a light-emitting device prepared by the method of preparing organic functional layers of a light-emitting device described above.

DETAILED DESCRIPTION OF THE EMBODIMENTS

Figure 1:
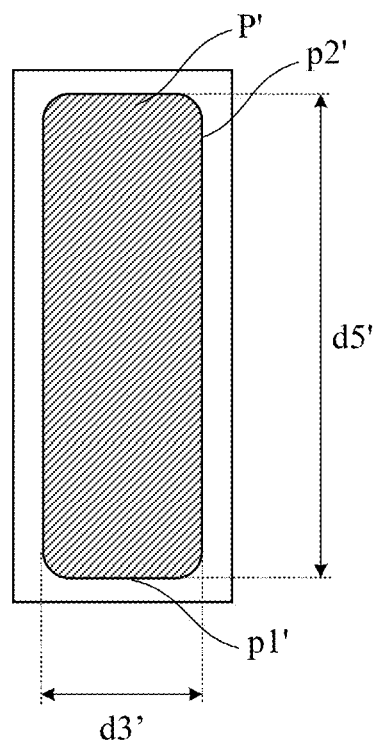
FIG. 1 illustrates a schematic top view of an organic functional layer prepared by a method of preparing organic functional layer of light-emitting device known to the inventors.

Exemplary embodiments will be described herein in detail, examples of which are represented in the accompanying drawings. Where the following description relates to the accompanying drawings, the same numerals in different accompanying drawings indicate same or similar elements unless otherwise indicated. The implementations described in the following exemplary embodiments do not represent all embodiments that are consistent with the present disclosure. Rather, they are only examples of devices that are consistent with some aspects of the present disclosure, as detailed in the appended claims.

The terms used in this disclosure are used solely for the purpose of describing particular embodiments and are not intended to limit the present disclosure. Unless otherwise defined, technical or scientific terms used in this disclosure shall have the ordinary meaning as understood by persons having ordinary skill in the art to which this disclosure pertains. The term "a" or "an" and similar terms used in the specification and claims of this disclosure also do not indicate a limitation in number, but rather the presence of at least one. The words "includes" or "comprises" and the like are intended to mean that the element or object appearing before "includes" or "comprises" covers the element or object listed after "includes" or "contains" and its equivalent, and does not exclude other elements or objects. Words such as "connected" or "connected" and the like are not limited to physical or mechanical connections, but may include electrical connections, whether direct or indirect. The term "plurality" includes two and is equivalent to at least two. The singular forms of "a", "the" and "the" as used in this specification and the appended claims are also intended to include the plurality unless the context clearly indicates otherwise. It should also be understood that the term "and/or" as used herein refers to and includes any or all possible combinations of one or more associated listed items.

In technologies known to the inventors, organic functional layer films of a display substrate are usually formed using a process such as inkjet printing. For example, when preparing sub-pixels in a display substrate, a pixel definition layer (PDL) is prepared on the substrate in advance, and shapes of the sub-pixels are defined by holding portions in the pixel definition layer. Then corresponding ink droplets are dropped into the holding portions by inkjet printing and organic functional layers of the sub-pixels are formed by drying.

In processes of forming a pixel definition layer known to the inventors, material of the pixel definition layer is heated to cause high polar fluorine-containing molecules in the material of the pixel definition layer to move towards an upper surface of the pixel definition layer away from the substrate. In this way, the upper and lower parts of the pixel definition layer are made of fluorine-containing material and non-fluorine-containing material, respectively, so that the upper part of the pixel definition layer (the part away from the substrate) has the property of repulsion (lyophobicity) to ensure that ink droplets do not overflow, and the lower part of the pixel definition layer (the part near the substrate) has the property of affinity (lyophilicity) to endow the lower structure with lyophilicity to ensure that ink droplets spread completely in the holding portions to avoid de-wetting phenomenon due to incomplete spreading of ink droplets in the holding portions. In the present disclosure, lyophilicity and lyophobicity are with respect to a same liquid phase medium. For example, when the liquid phase medium is water, the lyophilicity and lyophobicity are hydrophilicity and hydrophobicity; when the liquid phase medium is oil, lyophilicity and lyophobicity are oleophilicity and oleophobicity.

However, in such a pixel definition layer structure, the upper structure with lyophobicity is thin, while the lower structure with lyophilicity has a relatively large thickness; consequently, side walls of the pixel definition layer have a strong affinity for ink solution. As a result, during the drying process of the ink, the ink will climb along the side walls of the lower structure of the pixel definition layer to a lower portion of the upper structure, thus forming uneven films with thick edge and thin middle. This type of films with uneven thickness easily leads to uneven luminescence within a light-emitting device, which in turn affects the service life of the device.

In the ink drying process, an evaporation rate at the edge of the ink droplets is faster relative to an evaporation rate at the center of the ink droplets; consequently, the solvent at the edge of the ink droplets is lost more within a same time interval. This results in a concentration gradient difference between the edge of the ink droplets and the center of the ink droplets, which causes the solvent at the center of the ink droplets to flow towards the edge of the ink droplets. At the same time, part of the solute is carried to the edge of the ink droplets. In turn, during the drying process, the solute accumulates at the edge of the ink droplets, forming uneven films with a thick edge and a thin middle (also known as coffee ring structure). This type of uneven films easily leads to uneven luminescence of sub-pixels, affecting the service life of the display panel.

In the above methods for preparing organic functional layers of light-emitting device known to the inventors, the solvent of the ink droplets (ink) is cyclohexylbenzene, alkyl aromatic hydrocarbons and the like, which are solvents with low surface tension (≤30 mN/m), and the solute of the ink droplets is monomer of triphenylamine and crosslinking polymerization initiator. Both cyclohexylbenzene and alkyl aromatic hydrocarbons have roughly approximate saturation vapor pressure and relative polarity, leading to roughly approximate solubility of the solute therein. Serious climbing phenomenon occurs during the drying process of the ink droplets.

In the methods known to the inventors for preparing organic functional layers of light-emitting device, the above ink is printed in 200 mm*200 mm 80 PPI pixels at a concentration of 1 wt % and a dose of 36~54 pl (pico-liter) (e.g., a dose of 45 pl), and then the ink droplets are dried by vacuum condense dry (VCD). A temperature of a condensation plate in vacuum freezing equipment is 8~12° C. (e.g., 10° C.) and a temperature of the substrate is 36~54° C. (e.g., 45° C.). A dry pump is first turned on to vacuumize/pump down to 0.75 Torr. Then a turbo pump is turned on to vacuumize to 10-4 Torr and the vacuum pressure is maintained for 480~720 seconds (maintained until no liquid can be seen condensed on the condensation plate with naked eye) to have cyclohexylbenzene and alkyl aromatic hydrocarbons among the solvents of the ink droplets fully escaped. Then, the substrate and the pixel definition layer along with the ink droplets are placed in hot plate to undergo Hot Plate Baking (HPB) to dry other additives in the solvent of the ink droplets. A target thickness of the formed organic functional layers is 31.9 nm.

It should be noted that generally, for performance and energy efficiency, it is necessary to use a dry pump to pump down to a low vacuum first, and then start a turbo pump to pump down to a high vacuum. A high vacuum up to 10-4 Torr can be reached.

Figure 2:
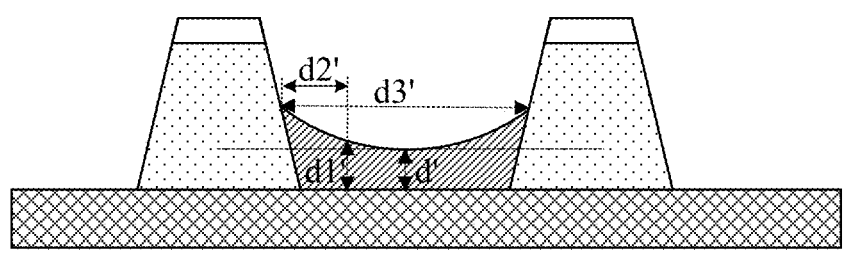
FIG. 2 illustrates a schematic sectional structure view of an organic functional layer prepared by a method of preparing organic functional layer of light-emitting device known to the inventors.

FIG. 1 illustrates a schematic top view of an organic functional layer prepared by a method of preparing organic functional layers of a light-emitting device known to the inventors, and FIG. 2 illustrates a schematic sectional structure view of an organic functional layer prepared by the method of preparing organic functional layers of a light-emitting device. As shown in FIGS. 1 and 2, the short side p1' of the organic functional layer is taken as an example, a length of the short side p1' is d3'. d' is the target thickness, d1' is 1.1d', and d2' is a distance from a point with a thickness of d1' to the long side p2'.

$$d2'/d3'=15\%.$$

Similarly, for the long side p2', a length of the long side p2' is d5' and d4' is a distance from the point with the thickness of d1' to the short side p1'.

$$d4'/d5'=5\%.$$

area thickness uniformity of the organic functional layer P'=(1−15%*2)*(1−5%*2)=63%.

Figure 3:
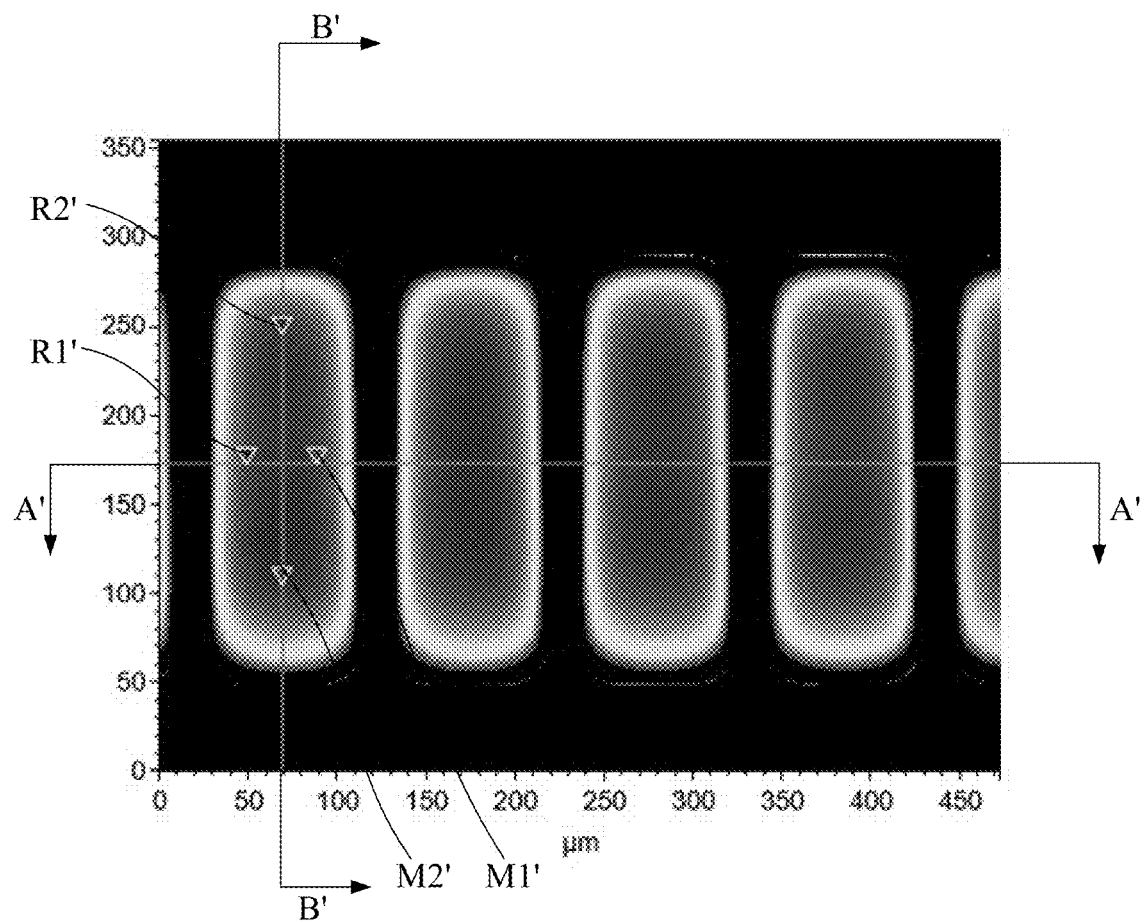
FIG. 3 illustrates the test effect of the organic functional layers prepared by a method of preparing organic functional layer of light-emitting device known to the inventors in a white light interferometer.
Figure 4A:
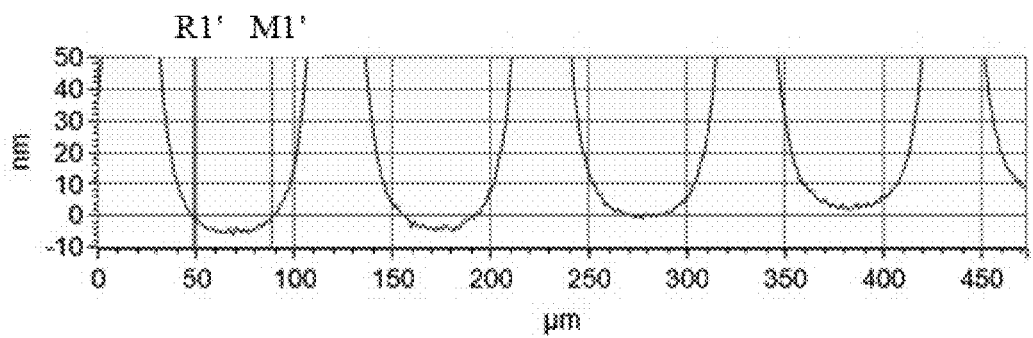
FIG. 4(a) shows the surface profile of a section of the organic functional layers along A'-A' in FIG. 3.
Figure 4B:
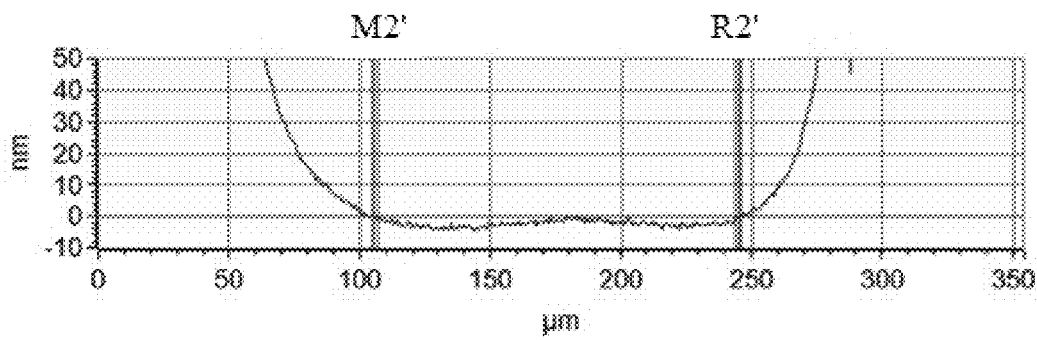
FIG. 4(b) shows the surface profile of a section of the organic functional layers along B'-B' in FIG. 3.

The test effect of the actually formed organic functional layers in a white light interferometer is shown in FIG. 3. The surface of the organic functional layers is severely U-shaped with a thickness uniformity of about 60%, resulting in uneven luminescence of the light-emitting device. FIG. 4(a) illustrates the surface profile of a section of the organic functional layers along A'-A' in FIG. 3, and FIG. 4(b) illustrates the surface profile of a section of the organic functional layers along B'-B' in FIG. 3, where positions of R1' and M1' in FIG. 4(a) correspond to positions of R1' and M1' in FIG. 3; similarly, positions of R2' and M2' in FIG. 4(b) correspond to positions of R2' and M2' in FIG. 3. The test results in FIGS. 4(a) and 4(b) show that the surface of the organic functional layers formed from printed ink droplets after vacuum condense dry (VCD) is severely U-shaped, especially in the direction of the short side of the organic functional layers, and the thickness uniformity is around 60%.

To alleviate the uneven film thickness caused by the above climbing effect, there are currently four mainstream solutions: 1) reducing the depth of the holding portions, for example from 1.5 um to 1.0 um, but the maximum capacity of the pixels is also reduced, contributing to a risk of overflow; 2) increasing the slope angle of the holding portions, increase in the slope angle can reduce the climbing effect of the ink droplets, but in view of the current process of exposure development etching (mainly the exposure amount will decrease with depth), the solution is difficult to implement; 3) increasing the lyophobicity of the side walls of the holding portions, which has not been solved by the material supplier; and 4) reducing the vacuum degree of the vacuum device (VCD) for drying ink droplets to the minimum by fast pumping down, thus reducing the climbing effect, however, it is likely to give films with thin edge and thick middle, and the organic functional layers with uniform thickness cannot be obtained.

At least one embodiment of the present disclosure provides a method of preparing organic functional layers of a light-emitting device.

The light-emitting device includes a plurality of first electrodes, a plurality of organic functional layers 60 and a plurality of second electrodes provided in sequence on a substrate 10, where one of the first electrode and the second electrode is a cathode and the other is an anode. In this embodiment, take the first electrode being the anode and the second electrode being the cathode as an example for illustration. An organic functional layer 60 may include a hole injection layer, a hole transport layer, an organic light-emitting layer, an electron transport layer, an electron injection layer, etc., provided in sequence along a direction from the first electrode to the second electrode. The method of preparing organic functional layers of a light-emitting device provided by at least one embodiment of the present disclosure is used for manufacturing any one of the above organic functional layers 60. The light-emitting device can be an Organic Light-Emitting Device (OLED). Of course, the light-emitting device can alternatively be other types of light-emitting devices, as long as they include an organic functional layer.

The method of preparing organic functional layers of a light-emitting device according to at least one embodiment of the present disclosure includes: forming a pixel definition layer on a substrate and forming a plurality of holding portions in the pixel definition layer; forming a plurality of ink droplets in the plurality of holding portions, the ink droplets being configured to form the plurality of organic functional layers of the light-emitting device, the ink droplets including a plurality of solvents and one or more solutes, the plurality of solvents including a first solvent and a second solvent, where a first saturated vapor pressure of the first solvent is higher than a second saturated vapor pressure of the second solvent, a first solubility of the first solvent for the one or more solutes is less than a second solubility of the second solvent for the one or more solutes, and a first affinity of lower parts of side walls of the holding portions for the first solvent is greater than a second affinity of the lower parts of the side walls of the holding portions for the second solvent; adjusting a vacuum degree of vacuum drying equipment to a first vacuum degree lower than the first saturated vapor pressure and higher than the second saturated vapor pressure to cause the first solvent to escape from the ink droplets, and maintaining the first vacuum degree until the first solvent is completely removed; and adjusting the vacuum degree of the vacuum drying equipment to a second vacuum degree lower than the second saturated vapor pressure to cause the second solvent to escape from the ink droplets, and maintaining the second vacuum degree until the second solvent is completely removed.

Being completely removed means that the amount of the first solvent removed under the first vacuum degree accounts for more than 95% of the total amount of the first solvent, and even if a certain amount of the first solvent remains, the residual first solvent does not climb up the side walls of the holding portions 30 when removing the second solvent, effectively reducing the climbing effect and improving the uniformity of the film thickness.

For methods of forming other structures in the light-emitting device, please refer to methods known to those skilled in the art.

In the following, the lower parts of the side walls of the holding portions being lyophilic and lyophobic will be discussed separately. In the present disclosure, lyophilicity and lyophobicity are relative to the same liquid phase medium. For example, when the liquid phase medium is water, lyophilicity and lyophobicity are hydrophilicity and hydrophobicity; when the liquid phase medium is oil, lyophilicity and lyophobicity are oleophilicity and oleophobicity.

Figure 5:
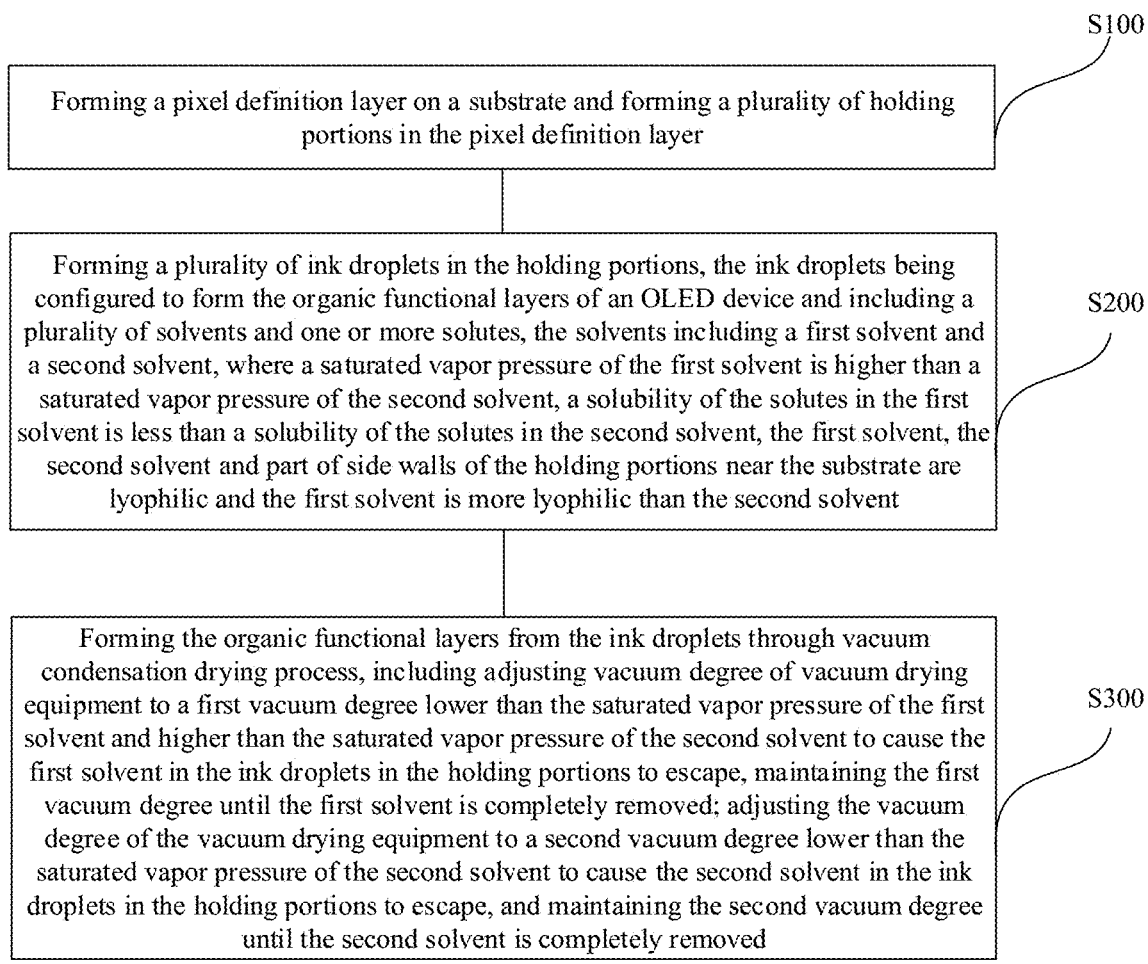
FIG. 5 illustrates a flowchart of a method for preparing organic functional layers of light-emitting device according to an embodiment of the present disclosure.

FIG. 5 is a flowchart of a method for preparing organic functional layers of a light-emitting device according to an exemplary embodiment of the present disclosure. As shown in FIG. 5, the method for preparing organic functional layers of a light-emitting device in this embodiment includes:

Step S100: forming a pixel definition layer on a substrate and forming a plurality of holding portions in the pixel definition layer.

Step S200: forming a plurality of ink droplets in the plurality of holding portions, the ink droplets including a plurality of solvents and one or more solutes, the plurality of solvents including a first solvent and a second solvent, where a first saturated vapor pressure of the first solvent is higher than a second saturated vapor pressure of the second solvent, a first solubility of the one or more solutes in the first solvent is less than a second solubility of the one or more solutes in the second solvent, and a first affinity of the lower parts of side walls of the holding portions for the first solvent is greater than a second affinity of the lower parts of the side walls of the holding portions for the second solvent.

Step S300: adjusting a vacuum degree of vacuum drying equipment to a first vacuum degree, the first vacuum degree being lower than the first saturated vapor pressure and higher than the second saturated vapor pressure to cause the first solvent to escape from the ink droplets and maintaining the first vacuum degree until the first solvent is completely removed; and adjusting the vacuum degree of the vacuum drying equipment to a second vacuum degree, the second vacuum degree being lower than the second saturated vapor pressure to cause the second solvent to escape from the ink droplets and maintaining the second vacuum degree until the second solvent is completely removed.

Prior to step S100, the method further includes forming an anodic conductive film on the substrate using a deposition process such as sputtering, and forming a pattern including the anodes by a patterning process.

The substrate, as a supporting component for electrode layers and organic functional layers in a light-emitting device, has good light transmission properties in the visible region and a certain degree of capability of preventing water vapor and oxygen penetration. Besides, the substrate has a good surface flatness and is usually made of glass or flexible substrate. If the flexible substrate is applied, it can be made of polyester, polyphthalimide or thinner metal.

The anodes, as connecting layers for the positive voltage of the light-emitting device, have good electrical conductivity, light transmission in the visible region, and a relatively high work function. The anodes can be made of inorganic metal oxides (e.g., indium tin oxide ITO, zinc oxide ZnO, etc.,), organic conductive polymers, or high work function metal materials (e.g., gold, copper, silver, platinum, etc.).

At step S100, as shown in FIG. 6($a$), a pixel definition layer 20 is formed on the substrate 10 by a patterning process and a plurality of holding portions 30 are formed in the pixel definition layer 20.

The holding portions 30 are openings in the pixel definition layer 20 and configured to hold ink droplets 40. In an embodiment of the present disclosure, the side wall of a holding portion 30 includes a lower part 21 near the substrate 10 and an upper part 22 away from the substrate 10. The two parts show opposite properties for the same liquid phase medium. For example, the lower part 21 is lyophilic (property of affinity for a liquid phase medium) for the liquid phase medium and the upper portion 22 is lyophobic (property of repulsion of the liquid phase medium) for the liquid phase medium; or, the lower part 21 is lyophobic (property of repulsion of a liquid phase medium) for the liquid phase medium and the upper portion 22 is lyophilic (property of affinity for the liquid phase medium) for the liquid phase medium. The lower part of the side wall of the holding portion 30 refers to the part of the side wall of the holding portion 30 that is in contact with and wetted by the ink droplet 40 during the preparation process and the upper part of the side wall of the holding portion 30 refers to the part of the side wall of the holding portion 30 that is not in contact with the ink droplet and thus is not wetted during the preparation process.

The embodiments of the present disclosure are illustrated by the example where the upper part of the side wall of the holding portion 30 is lyophobic and the lower part of the side wall of the holding portion 30 is lyophilic. For the ink droplets 40 to spread fully in the holding portions 30, the ink droplets 40 that dissolve the organic functional layer material also are lyophilic. At the same time, the substrate 10 may be made of a material such as glass, which is also lyophilic. In this case, both the bottom of the holding portion 30 (i.e., the substrate) and the lower part of the side wall of the holding portion 30 have affinity for ink droplets 40. When ink droplets 40 are formed in the holding portions 30, the ink droplets 40 are able to spread fully in the holding portions 30, thereby avoiding the de-wetting phenomenon caused by incomplete spreading of ink droplets 40. The upper parts of the side walls of the holding portions 30 are lyophobic to the ink droplets 40, so that the organic functional layer material dissolved in the plurality of solvents does not easily overflow out of the holding portions 30.

In some embodiments of the present disclosure, the pixel definition layer 20 may include a first definition layer and a second definition layer, where the first definition layer is provided on the substrate 10 and is lyophilic and the second definition layer is provided on the first definition layer and is lyophobic. Forming the pixel definition layer 20 and forming the plurality of holding portions 30 in the pixel definition layer 20 may include: forming the first definition layer on the substrate 10 as well as forming the second definition layer on the first definition layer, and forming the plurality of holding portions penetrating through the first definition layer and the second definition layer by a patterning process. The material of the first definition layer may include silicon oxide or silicon nitride having lyophilicity, and the material of the second definition layer may include a polymer resin, such as a fluorine-containing organic material such as polytetrafluoroethylene, polyvinylidene fluoride, heptafluoroacrylate film and the like, having lyophobicity.

Figure 6A:
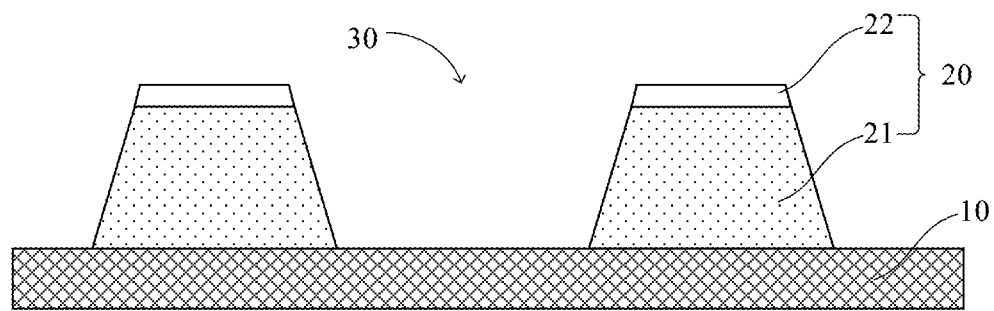
FIGS. 6(a) to 6(g) illustrate a process flow diagram of a method for preparing organic functional layers of light-emitting device according to an embodiment of the present disclosure.
Figure 6B:
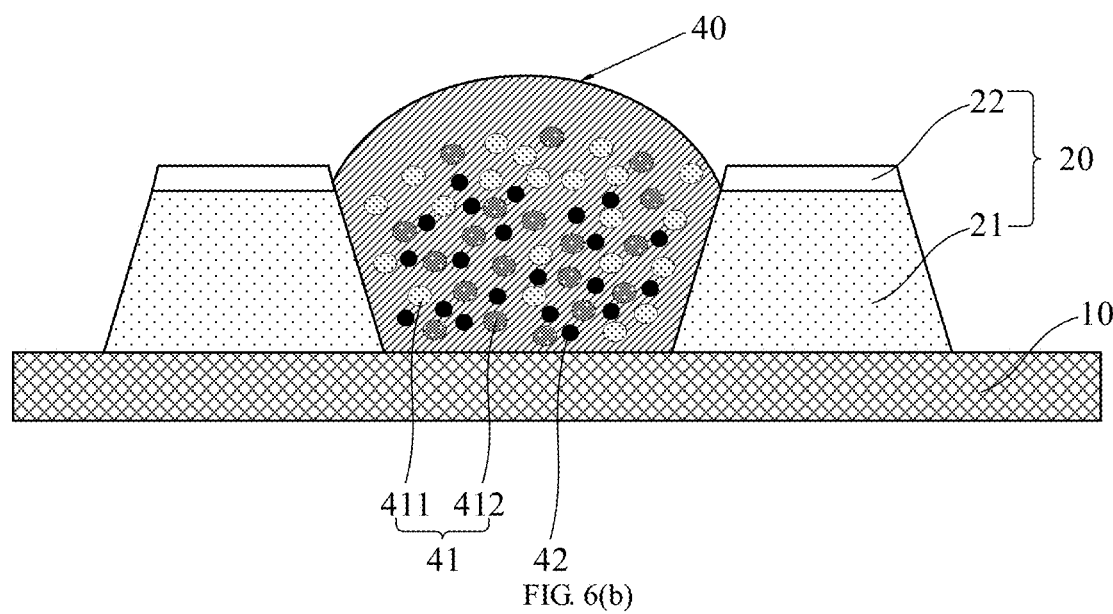

At step S200, ink droplets 40 are formed in the holding portions 30 as shown in FIG. 6(b) and the ink droplets 40 are used to form organic functional layers of an OLED device. The ink droplets 40 include a plurality of solvents 41 and one or more solutes 42. The plurality of solvents 41 include a first solvent 411 and a second solvent 412, where the first solvent 411 has a first saturated vapor pressure higher than a second saturated vapor pressure of the second solvent 412, and a first solubility of the one or more solutes 42 in the first solvent 411 is smaller than a second solubility of the one or more solutes 42 in the second solvent 412. The first solvent 411, the second solvent 412 and part of side walls of the holding portions 30 near the substrate 10 have lyophilicity, and the first solvent 411 is more lyophilic than the second solvent 412.

By mixing the one or more solutes 42 with the first solvent 411 and the second solvent 412, the ink to be dropped is formed and ink droplets 40 are formed in the holding portions 30 by an ink jet printing process. The one or more solutes 42 include organic functional layer materials for forming the organic functional layers. Since the organic functional layers in the light-emitting device may include a multilayer structure, such as a hole injection layer, a hole transport layer, an organic light-emitting layer, an electron transport layer, an electron injection layer, etc., the one or more solutes 42 in the ink will vary depending on the organic functional layer formed.

The substrate 10 and the lower parts of the side walls of the holding portions 30 have lyophilic properties, at the same time, the first solvent 411 and the second solvent 412 have lyophilic properties so that the ink droplets can spread sufficiently in the holding portions 30 in a case that the first solvent 411 and the second solvent 412 are well miscible. Further, a first lyophilicity of the first solvent 411 should be stronger than a second lyophilicity of the second solvent 412. In this case, the lower parts of the side walls of the holding portions 30 have lyophilicity, the first solvent 411 has the first lyophilicity, and the first lyophilicity is stronger than the second lyophilicity of the second solvent 412, so that when the ink is dropped into the holding portions 30 to form ink droplets 40, the first solvent 411 therein will spontaneously move to a position close to the side walls of the holding portions 30 (that is, the edge of the ink droplets 40), while the second solvent 412 is located in the middle of the holding portions 30 (that is, the center of the ink droplets 40) relative to the first solvent 411.

In an embodiment of the present disclosure, the first saturated vapor pressure of the first solvent 411 is higher than the second saturated vapor pressure of the second solvent 412, and the first solubility of the one or more solutes 42 in the first solvent 411 is less than the second solubility of the one or more solutes 42 in the second solvent 412, so that in the subsequent drying of ink droplets 40 to form organic functional layers, the vacuum degree of the vacuum drying equipment is first adjusted to the first vacuum degree lower than the first saturated vapor pressure of the first solvent, the first solvent 411 at the position near the side walls of the holding portions 30 escapes under the first vacuum degree, and the solute 42 previously dissolved in the first solvent 411 are dissolved in the second solvent 412. Then the second solvent 412 is caused to escape under the second vacuum degree. Because the lower part of the side walls of the holding portions 30 is less lyophilic to the second solvent 412, the second solvent 412 is located in the center of the holding portions 30, therefore, the solute will not be brought during the escape of the second solvent 412 to climb up the side walls of the holding portions 30, thus effectively reducing the climbing effect and improving the uniformity of the film thickness.

In the embodiment of the present disclosure, without affecting the maximum ink droplet loading amount, in the drying process, the climbing effect of highly concentrated ink on the lyophilic sidewalls of the pixel definition layer with the volatilization of the solvent can be reduced, avoiding the accumulation caused by solute migration, thus effectively alleviating the phenomenon of thick edge and thin middle of the organic functional layers caused by the climbing effect of ink droplets, and ensuring the thickness uniformity of the formed organic functional layers to the greatest extent.

In an embodiment of the present disclosure, the saturated vapor pressure of the first solvent 411 is greater than or equal to 105% of the saturated vapor pressure of the second solvent 412 to enable greater distinguishing between the first vacuum degree and the second vacuum degree during subsequent drying of ink droplets 40 to form the organic functional layers, while causing the first solvent 411 to be dried completely under the first vacuum degree and the second solvent 412 to be dried completely under the second vacuum degree.

In an embodiment of the present disclosure, among the solvents 41 of the ink droplets 40, the first solvent 411 has a volume proportion of greater than or equal to 70% and the second solvent 412 has a volume proportion of less than or equal to 30%. In an embodiment of the present disclosure, the first solvent 411 has a volume proportion of 70%~90% and the second solvent 412 has a volume proportion of 10%~30%, such that the ink droplets 40 can fully spread in the holding portions 30 with the first solvent 411.

In an embodiment of the present disclosure, the molecular polarity of the first solvent 411 is greater than the molecular polarity of the second solvent 412, and the molecular polarity of the second solvent 412 is 0~2.5, thereby achieving a stronger lyophilicity of the first solvent 411 than the second solvent 412.

The first solvent 411 includes at least one of cyclohexylbenzene, carbonates, alkyl aromatic hydrocarbons, aromatic hydrocarbons, aromatic esters, 4-methylanisole, toluene, 1,3-dimethyl-2-imidazolinone, diethylene glycol, or 2-(2-methoxyethoxy) ethanol. The second solvent 412 includes at least one of 1,4-dioxane, dichlorobenzene, diphenyl ether, dodecane, sulfolane, or ethylene glycol dimethyl ether. It should be noted that during the formation of the organic functional layers, when the first solvent and the second solvent in the same ink droplet are selected, it is sufficient that the first solvent and the second solvent meet the above-mentioned qualifications.

In an embodiment of the present disclosure, an absolute value of a difference between a surface tension coefficient of the first solvent 411 and a surface tension coefficient of the second solvent 412 is less than 5% of the surface tension coefficient of the first solvent 411, i.e., the surface tension of the first solvent 411 is approximate to the surface tension of the second solvent 412, thereby enabling the ink solution to be sufficiently miscible to form a stable ink solution system. In a further example, the surface tension of the first solvent 411 is the same as the surface tension of the second solvent 412.

In some embodiments of the present disclosure, the substrate 10 and the lower parts of the side walls of the holding portions 30 are lyophobic to a certain liquid phase medium. In this case, the first solvent 411 and the second solvent 412 are selected to possess lyophobicity to that liquid phase medium, and the lyophobicity of the first solvent 411 is stronger than the lyophobicity of the second solvent 412, i.e., a first affinity of the lower parts of the side walls of the holding portions 30 for the first solvent 411 is greater than a second affinity of the lower parts of the side walls of the holding portions 30 for the second solvent 412. At the same time, the saturation vapor pressure of the first solvent 411 is higher than the saturation vapor pressure of the second solvent 412, and the solubility of the one or more solutes 42 in the first solvent 411 is less than the solubility of the one or more solutes 42 in the second solvent 412 in a same case. In this case, the ink droplets 40 are likewise able to spread sufficiently in the holding portions 30 when the first solvent 411 and the second solvent 412 are sufficiently miscible. Since the affinity of the lower parts of the side walls of the holding portions 30 for the first solvent 411 is greater than the affinity of the lower parts of the side walls of the holding portions 30 for the second solvent 412, the first solvent 411 spontaneously moves to a position close to the side walls of the holding portions 30 (i.e., the edge of the ink droplets 40), while the second solvent 412 is located in the center of the holding portions 30 (i.e., the center of the ink droplets 40) relative to the first solvent 411. At this time, the molecular polarity of the second solvent 412 is greater than the molecular polarity of the first solvent 411, and the molecular polarity of the first solvent 411 is 0~2.5, thereby achieving a stronger lyophobicity capability of the first solvent 411 than the second solvent 412. The first solvent 411 may include at least one of cyclohexane, isooctane, trimethylpentane, diethylene glycol, or ethylene glycol dimethyl ether. The second solvent 412 may include at least one of carbon tetrachloride, trichloroethylene, cyclopentane or propyl ether.

In the case where the first solvent 411, the second solvent 412 and the lower part of the side walls of the holding portions 30 are lyophobic to the same liquid phase medium, and the lyophobicity of the first solvent 411 is stronger than the lyophobicity of the second solvent 412:

In an embodiment of the present disclosure, the first solvent 411 has a saturated vapor pressure greater than or equal to 105% of the saturated vapor pressure of the second solvent 412 to enable a greater distinguishing between the first vacuum degree and the second vacuum degree in the subsequent drying of ink droplets 40 to form organic functional layers, while causing the first solvent 411 to be dried completely under the first vacuum degree and the second solvent 412 to be dried completely under the second vacuum degree.

In an embodiment of the present disclosure, among the solvents 41 of the ink droplets 40, the volume proportion of the first solvent 411 is greater than or equal to 70% and the volume proportion of the second solvent 412 is less than or equal to 30%. In a further example, the volume proportion of the first solvent 411 is 70%~90% and the volume proportion of the second solvent 412 is 10%~30%, such that the first solvent 411 in the solvents 41 enables the ink droplets 40 to fully spread in the holding portions 30.

In an embodiment of the present disclosure, an absolute value of a difference between a surface tension coefficient of the first solvent 411 and a surface tension coefficient of the second solvent 412 is less than 5% of the surface tension coefficient of the first solvent 411, that is to say, the surface tension of the first solvent 411 is approximate to the surface tension of the second solvent 412, thereby enabling the ink solution to be sufficiently miscible to form a stable ink solution system. In a further example, the surface tension of the first solvent 411 is the same as the surface tension of the second solvent 412.

Figure 6C:
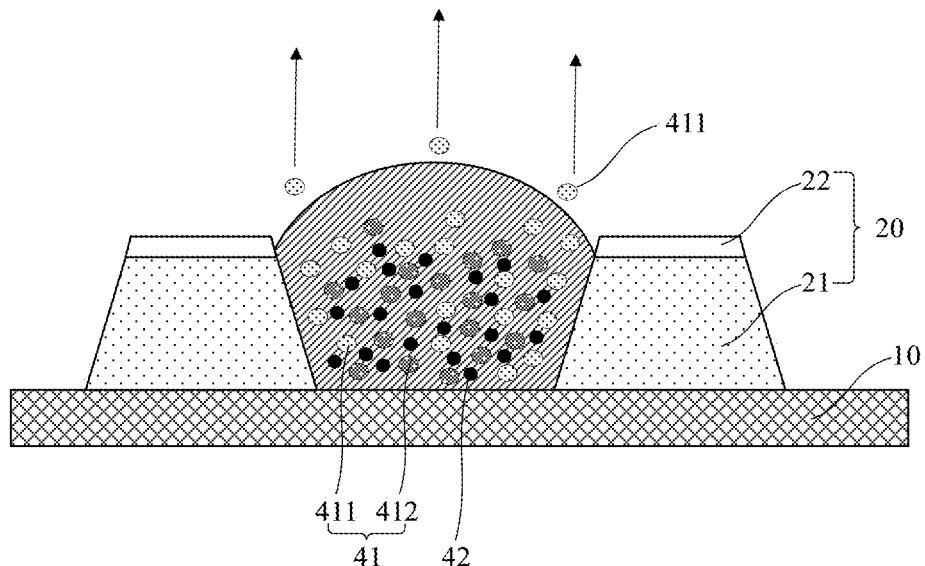
Figure 6D:
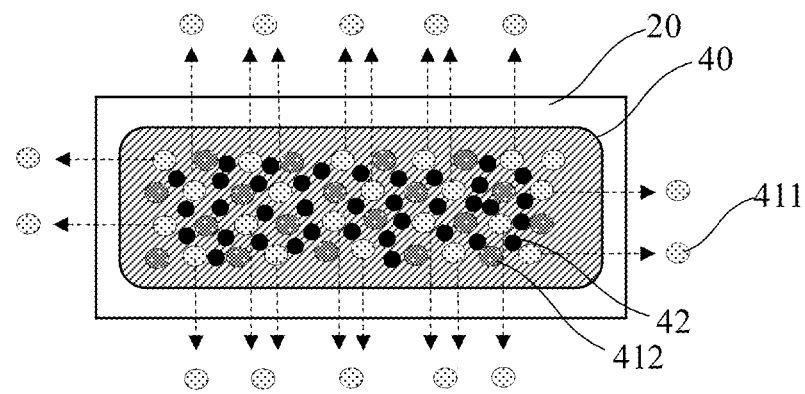

At step S300, the ink droplets are processed to form organic functional layers by a vacuum condensation drying process. The vacuum condensation drying process refers to a process in which a solvent is caused to escape from a solution through evaporation by pumping down with a pump in vacuum drying equipment to reach the saturation vapor pressure of the solvent in the solution to be dried, part of the evaporated solvent is pumped out and the remaining part is transferred out after contact with a condensation plate placed above the substrate in which the solution is held and being condensed (the temperature of the condensation plate is lower than the temperature of the substrate). Step 300 may include:

Step S310: as shown in FIGS. 6(c) and 6(d), the vacuum degree of the vacuum drying equipment is adjusted to a first vacuum degree lower than the saturated vapor pressure of the first solvent 411 and higher than the saturated vapor pressure of the second solvent 412, to cause the first solvent 411 in the ink droplets 40 in the holding portions 30 to escape. The first vacuum degree is maintained until the first solvent 411 is completely removed. FIG. 6(d) shows a schematic diagram of FIG. 6(c) from the top.

When the vacuum degree of vacuum drying equipment reaches the first vacuum degree, since the saturated vapor pressure of the first solvent 411 is reached, the first solvent 411 is caused to evaporate and escape from the ink droplets 40. Part of the evaporated solvent is directly pumped away, and the remaining part encounters a condensation plate above the substrate and is transferred away after condensation.

The time duration in which the first vacuum degree is maintained until completion of removal of the first solvent 411 is determined based on visual observation that no more liquid condenses on the condensation plate by the naked eye.

Figure 6E:
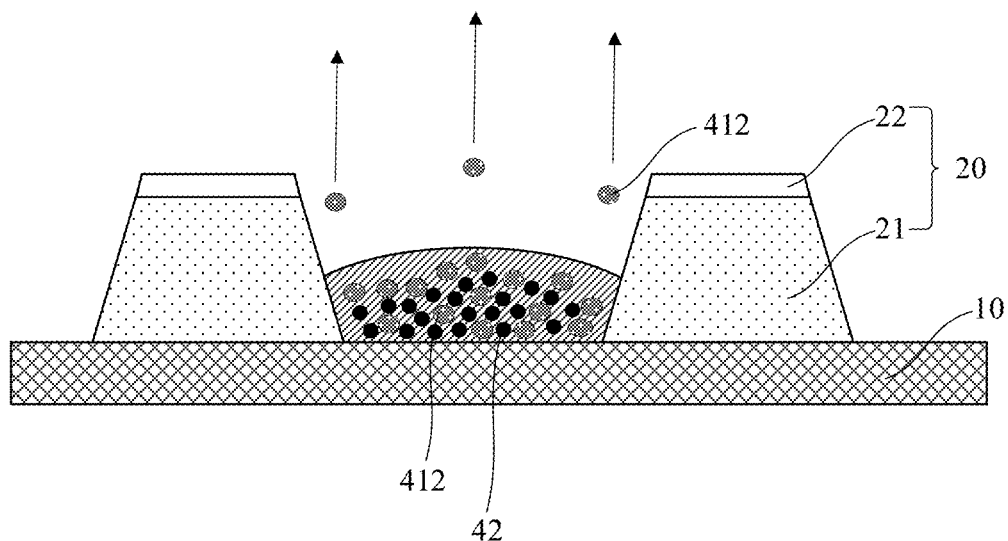
Figure 6F:
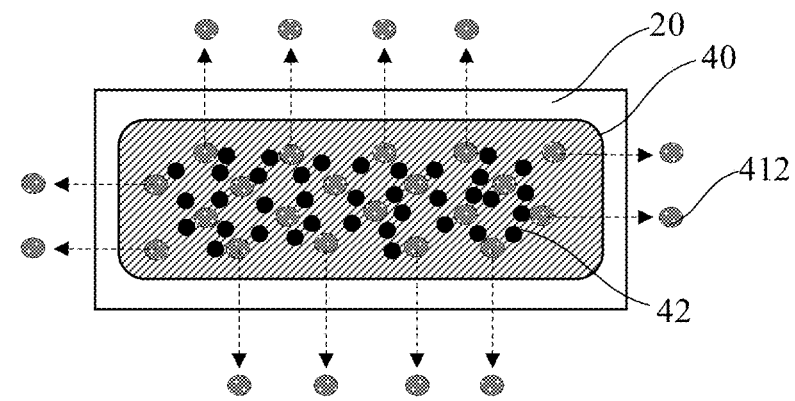

Step S320: as shown in FIGS. 6(e) and 6(f), the vacuum degree of the vacuum drying equipment is adjusted to a second vacuum degree lower than the saturated vapor pressure of the second solvent 412 to cause the second solvent 412 in the ink droplets 40 in the holding portions 30 to escape. The second vacuum degree is maintained until the second solvent 412 is completely removed. FIG. 6(f) shows a schematic diagram of FIG. 6(e) from the top.

When the vacuum degree of the vacuum drying equipment reaches the second vacuum degree, because the saturation vapor pressure of the second solvent 412 is reached, the solvent 412 is caused to evaporate and escape from the ink droplets 40. Part of the evaporated solvent is directly pumped away, and the rest encounters the condensation plate above the substrate and is transferred away after condensation.

The time duration in which the second vacuum is maintained until completion of removal of the second solvent 412 is determined based on visual observation that no more liquid condenses on the condensation plate by the naked eye.

In the above step S310, the first solvent 411 with higher saturated vapor pressure in the ink droplets 40 is first caused to escape by adjusting the vacuum degree of the vacuum drying equipment to the first vacuum degree, so that only the second solvent 412 with lower saturated vapor pressure remains in the ink droplet 40 solution. At this time, all the solutes 42 are dissolved in the second solvent 412, and the climbing height of the second solvent 412 up the side walls of the holding portions 30 is relatively smaller. At the above step S320, the second solvent is caused to escape by adjusting the vacuum degree of the vacuum drying equipment to the second vacuum degree. The climbing height of the second solvent 412 up on the side walls of the holding portions 30 is relatively smaller, so that the surface of the finally formed organic functional layers is relatively flat and the uniformity of the film thickness reaches about 85%.

As mentioned above, in the embodiments of the present disclosure, the vacuum degree of the vacuum drying equipment is adjusted stepwise to cause the first solvent 411 to completely escape under the first vacuum degree and the solutes previously dissolved in the first solvent 411 are dissolved in the second solvent 412. Then the vacuum degree of the vacuum drying equipment is adjusted to the second vacuum degree, because the second solvent 412 is less lyophilic to the side walls of the holding portions 30, the solutes 42 will not be brought to climb the side walls of the holding portions 30 during the escape of the second solvent 412, which effectively reduces climbing effect, improves the film thickness uniformity as well as the effective aperture ratio of the device, and enhances the service life of the display panel.

If the vacuum degree of the vacuum drying equipment is made directly to reach the vacuum degree at which the second solvent 412 escapes, the first solvent 411 and the second solvent 412 will evaporate and escape at the same time. With the escape of the first solvent 411 and the second solvent 412, the concentration of the ink droplets 40 becomes higher. When the concentration of the ink droplets 40 becomes higher, due to the stronger affinity of the lower parts of the side walls of the holding portions 30 for the first solvent, the remaining first solvent 411 is likely to bring the ink droplets 40 to move to produce a climbing effect in the process of escape, thus the uniformity of film thickness cannot be well improved.

Figure 6G:
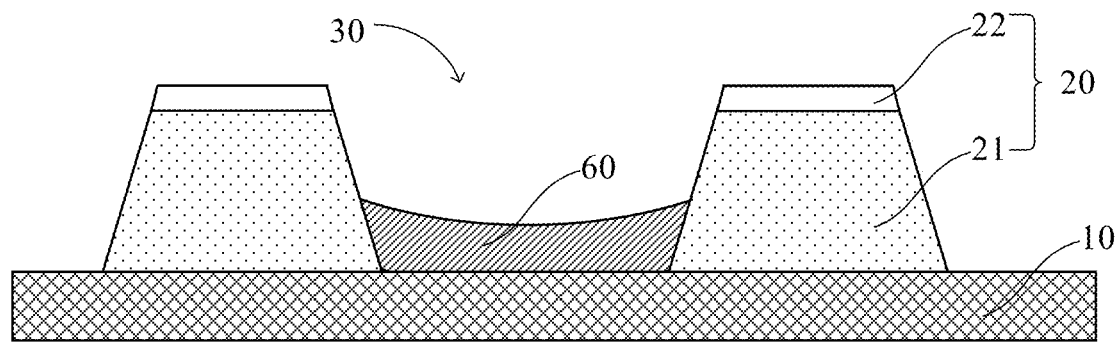

The structure of the resulting organic functional layers 60 is shown in FIG. 6(g).

After completion of step S300, the method further includes a step of forming a plurality of cathodes using a process such as vacuum vapor deposition on the substrate 10 with organic functional layers 60 formed thereon.

The cathodes, as a connecting layer for connecting a negative voltage of the organic electrolight-emitting device, has relatively good conductivity and relatively low work function. The cathodes are usually made of metal materials with low work function, such as: lithium, magnesium, calcium, strontium, aluminum, indium, etc., or an alloy of the above metals and copper, gold or silver. Alternatively, the cathodes are made of a very thin buffer insulation layer (such as lithium fluoride LiF, cesium carbonate $CsCO_3$, etc.,) and the above metals or alloys.

In some embodiments of the present disclosure, the ink droplets includes a first solvent, a second solvent, and one or more solutes, where the saturated vapor pressure of the first solvent is higher than the saturated vapor pressure of the second solvent, and the solubility of the one or more solutes in the first solvent is less than the solubility of the one or more solutes in the second solvent, and the first affinity of lower parts of side walls of the holding portions for the first solvent is greater than the second affinity of lower parts of side walls of the holding portions for the second solvent; and, forming organic functional layers by processing the ink droplets with a vacuum condensation drying process includes: adjusting the vacuum degree of the vacuum drying equipment to a first vacuum degree lower than the saturated vapor pressure of the first solvent and higher than the saturated vapor pressure of the second solvent, to cause the first solvent in the ink droplets in the holding portions to escape and maintaining the first vacuum degree until completion of removal of the first solvent; and adjusting the vacuum degree of the vacuum drying equipment to a second vacuum degree lower than the saturated vapor pressure of the second solvent to cause the second solvent in the ink droplets in the holding portions, and maintaining the second vacuum degree until completion of removal of the second solvent. In this way, organic functional layers with a relatively flatter surface are obtained.

In an embodiment of the present disclosure, the solvents of the ink droplet (ink) include a first solvent and a second solvent. The first solvent includes cyclohexylbenzene and alkyl aromatic hydrocarbons and the second solvent is 1,4-dioxane. The first solvent makes up 70% of the solvents, and the second solvent accounts for 30% of the solvents. The solutes of the ink droplets are monomer of triphenylamine and a crosslinking polymerization initiator. The saturated vapor pressure of the first solvent is higher than the saturated vapor pressure of the second solvent, and the solubility of the solutes in the first solvent is less than the solubility of the solutes in the second solvent. The first solvent, the second solvent, and the lower parts of the side walls of the holding portions are lyophilic for the same liquid phase medium, and the lyophilicity of the first solvent is stronger than the lyophilicity of the second solvent. When drying the ink droplets to form the organic functional layers, the first solvent at the position close to the side walls of the holding portions is first made to escape under the first vacuum degree, and the solutes previously dissolved in the first solvent will dissolve in the second solvent. Then the second solvent is made to escape under the second vacuum degree. Because the second solvent (located at the center of the holding portions) has a relatively low affinity for the side walls of the holding portions, climbing of the ink droplets at a high concentration is minimized. Therefore, the solutes will not be brought to climb the side walls of the holding portions during the escape of the second solvent, thus effectively reducing the climbing effect, improving the uniformity of the film thickness, increasing the effective aperture ratio of the device, and enhancing the service life of the display panel.

The above ink is printed in 200 mm*200 mm 80 PPI pixels at a concentration of 0.75 wt % and a dose of 48~72 (pico-liter, 10E-12 liter) (e.g., a dose of 60 pl), and then the ink droplets are dried by vacuum condense dry (VCD). A temperature of a condensation plate in vacuum freezing equipment is 8~12° C. (e.g., 10° C.) and a temperature of a glass plate is 36~54° C. (e.g., 45° C., the glass plate here is the substrate mentioned above). A dry pump is first turned on to vacuumize/pump down to 0.75 Torr. Then a turbo pump is turned on to vacuumize to 10-2 Torr (the first vacuum degree) and the vacuum degree is maintained for 240~360 seconds (maintained until no liquid can be seen condensed on the condensation plate with naked eye) to have the first solvent in the solvents of the ink droplets fully escaped. Pump down to 10-4 Torr (the second vacuum degree) with the turbo pump and the vacuum degree is maintained for 480~720 seconds (maintained until no liquid can be seen condensed on the condensation plate with naked eye) to have the second solvent in the solvents of the ink droplets fully escaped. Then, the substrate and the pixel definition layer along with the ink droplets are placed in hot plate to undergo Hot Plate Baking (HPB) to dry other additives in the solvents of the ink droplets. A target thickness of the formed organic functional layers is 31.9 nm.

Figure 7:
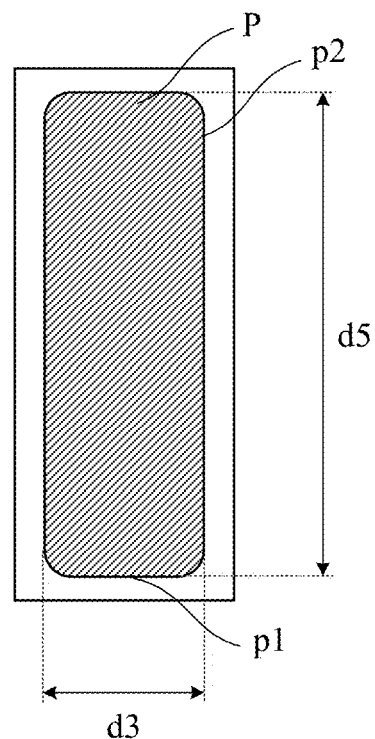
FIG. 7 is a schematic diagram of the top view of an organic functional layer prepared by a method of preparing organic functional layer of light-emitting device according to an embodiment of the present disclosure.
Figure 8:
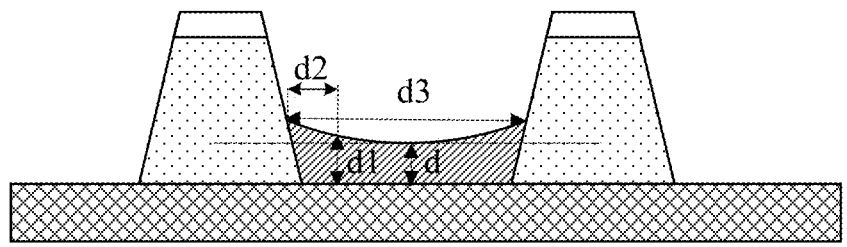
FIG. 8 is a schematic diagram of the sectional structure view of an organic functional layer prepared by a method of preparing organic functional layer of light-emitting device according to an embodiment of the present disclosure.

As shown in the FIGS. 7 and 8, the short side p1 of the organic functional layer is taken as an example. The length of the short side p1 is d3 and d is the target thickness. d1 is 1.1d, and d2 is the distance from a point with a thickness of d1 to the long side p2.

$$d2/d3=7.5\%.$$

Similarly, for the long side p2, the length of the long side p2 is d5 and d4 is the distance of from a point with a thickness of d1 to the short side p1.

$$d4/d5=2\%.$$

area film thickness uniformity of the organic functional layer P is=(1−7.5%*2)*(1−2%*2)=81.6%.

Figure 9:
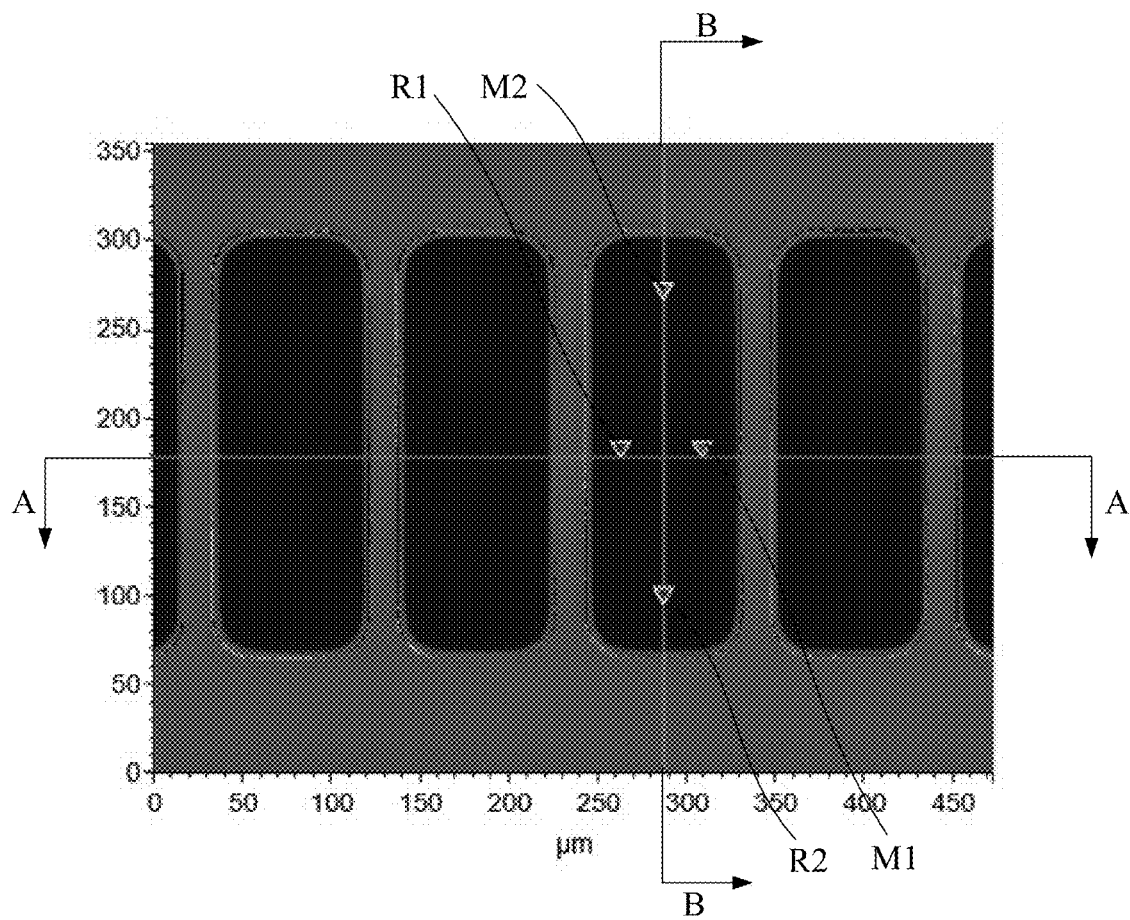
FIG. 9 illustrates the test effect of the organic functional layers prepared by the method of preparing organic functional layers of light-emitting device according to an embodiment of the present disclosure in a white light interferometer.

Test results of the actually formed organic functional layers in a white light interferometer are shown in FIG. 9. Since the surface of the organic functional layers is relatively flat, film thickness quality has been well improved. Thickness uniformity reaches about 85%, contributing to relatively uniform luminescence of the organic functional layers.

Figure 10A:
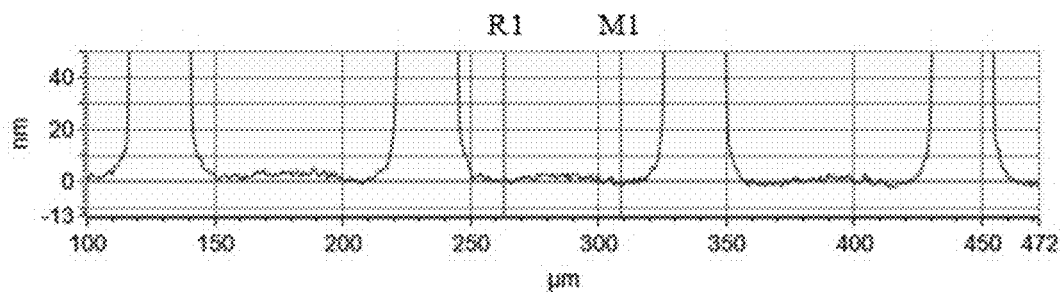
FIG. 10(a) shows the surface profile of a section of the organic functional layers along A-A in FIG. 9.
Figures 10B, 11:
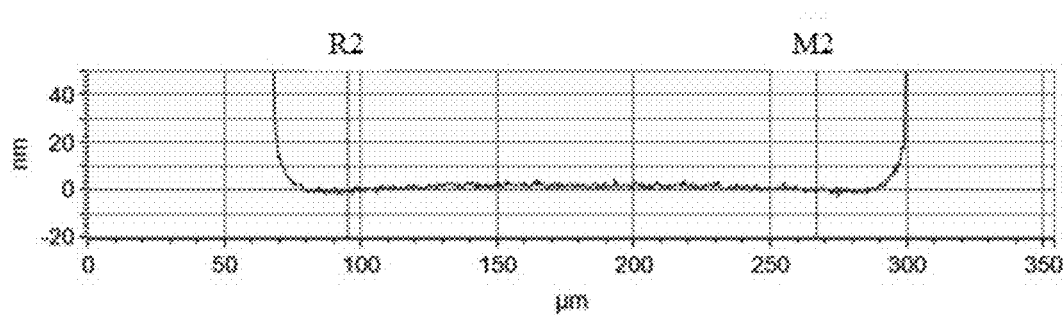
FIG. 10(b) shows the surface profile of a section of the organic functional layers along B-B in FIG. 9.
FIG. 11 is a table showing comparison of effectiveness of the method of preparing organic functional layers of light-emitting device according to an embodiment of the present disclosure and the method of preparing organic functional layer of light-emitting device known to the inventors.

FIG. 10(a) illustrates the surface profile of a section of the organic functional layers along A-A in FIG. 9, and FIG. 10(b) illustrates the surface profile of a section of the organic functional layers along B-B in FIG. 9, where positions of R1 and M1 in FIG. 10(a) correspond to positions of R1 and M1 in FIG. 9; similarly, positions of R2 and M2 in FIG. 10(b) correspond to positions of R2 and M2 in FIG. 9. The test results in FIGS. 10(a) and 10(b) show that the surface of the organic functional layers formed from printed ink droplets after vacuum condense dry (VCD) is relatively flat. Film thickness quality has been well improved and thickness uniformity reaches about 85%.

As can be seen from the above comparison, as shown in FIG. 11, under essentially the same process conditions, the short side, long side, and area film thickness uniformity of the organic functional layers P formed by the method of preparing organic functional layers of a light-emitting device according to the embodiment are far superior to the short side, long side, and area film thickness uniformity of the organic functional layers P' formed by the method of preparing organic functional layers of a light-emitting device known to the inventors.

The embodiments provide a method of preparing a display panel including a method of preparing organic functional layers of a light-emitting device according to the above embodiments, where the display panel includes a light-emitting device.

In the method of preparing a display panel according to an embodiment of the present disclosure, when forming organic functional layers in a light-emitting device, solvents including a first solvent and a second solvent are selected as solvents for the organic functional layer material, where the saturated vapor pressure of the first solvent is higher than the saturated vapor pressure of the second solvent, and the solubility of the solutes in the first solvent is less than the solubility of the solutes in the second solvent. The first solvent, the second solvent, and the part of the side walls of the holding portions near the substrate are lyophilic (or lyophobic) for the same liquid phase medium, and the first solvent has a stronger lyophilicity (or lyophobicity) than the second solvent such that a first affinity of the lower part of the side walls of the holding portions for the first solvent is greater than a second affinity of the lower part of the side walls of the holding portions for the second solvent. In the process of drying the ink droplets to form the organic functional layers, the first solvent at a position close to the side walls of the holding portions is first made to escape under the first vacuum degree, and the solutes previously dissolved in the first solvent will dissolve in the second solvent. Then the second solvent is made to escape under the second vacuum degree. Because the second solvent (located at the center of the holding portions) has a relatively low affinity for the side walls of the holding portions, climbing of the ink droplets at a high concentration is minimized. Therefore, the solutes will not be brought to climb the side walls of the holding portions during the escape of the second solvent, thus effectively reducing the climbing effect, improving the uniformity of the film thickness, increasing the effective aperture ratio of the device, and enhancing the service life of the display panel.

At least one embodiment of the present disclosure also provides a display panel including a light-emitting device, the light-emitting device including organic functional layers prepared by the method of preparing organic functional layers of a light-emitting device described above.

The foregoing is only embodiments consistent with some aspects of the present disclosure and are not intended to limit the present disclosure. Any modifications, equivalent substitutions, improvements, etc. made within the spirit and principles of the present disclosure shall be included within the scope of protection of the present disclosure.

The invention claimed is:

1. A method of preparing organic functional layers of a light-emitting device comprising:
forming a pixel definition layer on a substrate;
forming a plurality of holding portions in the pixel definition layer;
forming a plurality of ink droplets in the holding portions, the ink droplets comprising a plurality of solvents and one or more solutes, the solvents comprising a first solvent and a second solvent, wherein a first saturated vapor pressure of the first solvent is higher than a second saturated vapor pressure of the second solvent, a first solubility of the one or more solutes in the first solvent is less than a second solubility of the one or more solutes in the second solvent, and a first affinity of lower parts of side walls of the holding portions near the substrate for the first solvent is greater than a second affinity of the lower parts of the side walls of the holding portions near the substrate for the second solvent;

adjusting a vacuum degree of vacuum drying equipment to a first vacuum degree, the first vacuum degree being lower than the first saturated vapor pressure and higher than the second saturated vapor pressure to cause the first solvent to escape from the ink droplets, and maintaining the first vacuum degree until the first solvent is completely removed; and adjusting the vacuum degree of the vacuum drying equipment to a second vacuum degree, the second vacuum degree being lower than the second saturated vapor pressure, to cause the second solvent to escape from the ink droplets, and maintaining the second vacuum degree until the second solvent is completely removed.

2. The method according to the claim 1, wherein
the first solvent, the second solvent and the lower parts of the side walls of the holding portions are lyophilic,
the first solvent has a molecular polarity greater than that of the second solvent, and
the second solvent has a molecular polarity of 0~2.5.

3. The method according to the claim 1, wherein
the first solvent, the second solvent and the lower parts of the side walls of the holding portions are lyophilic,
the first solvent comprises at least one of cyclohexylbenzene, carbonate, alkyl aromatic hydrocarbon, aromatic hydrocarbon, aromatic ester, 4-methylanisole, toluene, 1,3-dimethyl-2-imidazolinone, diethylene glycol, or 2-(2-methoxyethoxy) ethanol, and
the second solvent comprises at least one of 1,4-dioxane, dichlorobenzene, diphenyl ether, dodecane, sulfolane, or ethylene glycol dimethyl ether.

4. The method according to the claim 1, wherein
the first solvent, the second solvent and the lower parts of the side walls of the holding portions are lyophobic, and
the second solvent has a molecular polarity greater than that of the first solvent, and the first solvent has a molecular polarity of 0~2.5.

5. The method according to the claim 1, wherein
the first solvent, the second solvent and the lower parts of the side walls of the holding portions are lyophobic, the first solvent comprises at least one of cyclohexane, isooctane, trimethylpentane, diethylene glycol, or ethylene glycol dimethyl ether, and
the second solvent comprises at least one of carbon tetrachloride, trichloroethylene, cyclopentane, or propyl ether.

6. The method according to claim 1, wherein the first saturated vapor pressure is greater than or equal to 105% of the second saturated vapor pressure.

7. The method according to claim 1, wherein in the solvents of the ink droplets, a volume proportion of the first solvent is greater than or equal to 70% and a volume proportion of the second solvent is less than or equal to 30%.

8. The method according to claim 1, wherein in the solvents of the ink droplets, a volume proportion of the first solvent is 70%~90% and the volume proportion of the second solvent is 10%~30%.

9. The method according to claim 1, wherein an absolute value of a difference between a surface tension coefficient of the first solvent and a surface tension coefficient of the second solvent is less than 5% of the surface tension coefficient of the first solvent.

10. The method according to claim 1, wherein the first solvent has the same surface tension as the second solvent.

11. The method according to claim 1, wherein
forming the pixel definition layer on the substrate comprises:
forming a first pixel definition layer on the substrate; and
forming a second pixel definition layer on the first pixel definition layer,
wherein the first pixel definition layer and the second pixel definition layer show opposite properties for a same liquid phase medium.

12. The method according to claim 1, wherein
forming the plurality of ink droplets in the holding portions comprises:
forming the plurality of ink droplets in the holding portions by an inkjet printing process.

13. A method of preparing a display panel, comprising the method of preparing organic functional layers of a light-emitting device according to claim 1.

14. A display panel, comprising a light-emitting device, wherein the light-emitting device comprises organic functional layers prepared by the method according to claim 1.

* * * * *